United States Patent
Kharrat et al.

(10) Patent No.: US 9,735,603 B2
(45) Date of Patent: Aug. 15, 2017

(54) FACILITY FOR CONTROLLING AN ENERGY STORAGE BATTERY

(71) Applicant: ELECTRICITE DE FRANCE, Paris (FR)

(72) Inventors: Chady Kharrat, Carrieres sur Seine (FR); Ala Ben-Abbes, Issy les Moulineaux (FR)

(73) Assignee: ELECTRICITE DE FRANCE, Paris (FR)

( * ) Notice: Subject to any disclaimer, the term of this patent is extended or adjusted under 35 U.S.C. 154(b) by 62 days.

(21) Appl. No.: 14/434,341

(22) PCT Filed: Oct. 8, 2013

(86) PCT No.: PCT/EP2013/070924
§ 371 (c)(1),
(2) Date: Apr. 8, 2015

(87) PCT Pub. No.: WO2014/056898
PCT Pub. Date: Apr. 17, 2014

(65) Prior Publication Data
US 2015/0263563 A1    Sep. 17, 2015

(30) Foreign Application Priority Data

Oct. 9, 2012 (FR) .................. 12 59624

(51) Int. Cl.
*H02J 7/00* (2006.01)
*G01R 31/36* (2006.01)
(Continued)

(52) U.S. Cl.
CPC ........ *H02J 7/0072* (2013.01); *G01R 31/3606* (2013.01); *G01R 31/3648* (2013.01);
(Continued)

(58) Field of Classification Search
CPC ............. G01R 31/3648; G01R 31/3606; H02J 7/0031; H02J 7/0072
(Continued)

(56) References Cited

U.S. PATENT DOCUMENTS 4,637,910 A * 1/1987 Impink, Jr. ............ G21C 17/00
376/215
2012/0074909 A1    3/2012 Hondo et al.
(Continued)

*Primary Examiner* — M'Baye Diao
(74) *Attorney, Agent, or Firm* — Blakely Sokoloff Taylor & Zafman LLP

(57) ABSTRACT

The invention relates to a control facility, and the associated control method, for an energy storage battery (2) intended to be coupled to an intermittent electrical production source for providing an electrical energy network with a total electrical power approximating a total power setpoint (Prod (T)) according to a production plan, the control facility (1) is adapted for determining a reference trajectory of the state of charge of the battery (SOC_ref(t)) on the basis of a modeling of the battery (5) and of an optimized battery setpoint (Pbatt(T)), said optimized battery power setpoint (Pbatt(T)) being determined on the basis of the total power setpoint (Prod(T)), and the control facility (1) is adapted for implementing a closed-loop regulation of the state of charge of the battery so as to force the state of charge (SOC(t)) to follow the reference trajectory of the state charge of the battery (SOC_ref(t)).

12 Claims, 2 Drawing Sheets

Figure 1:
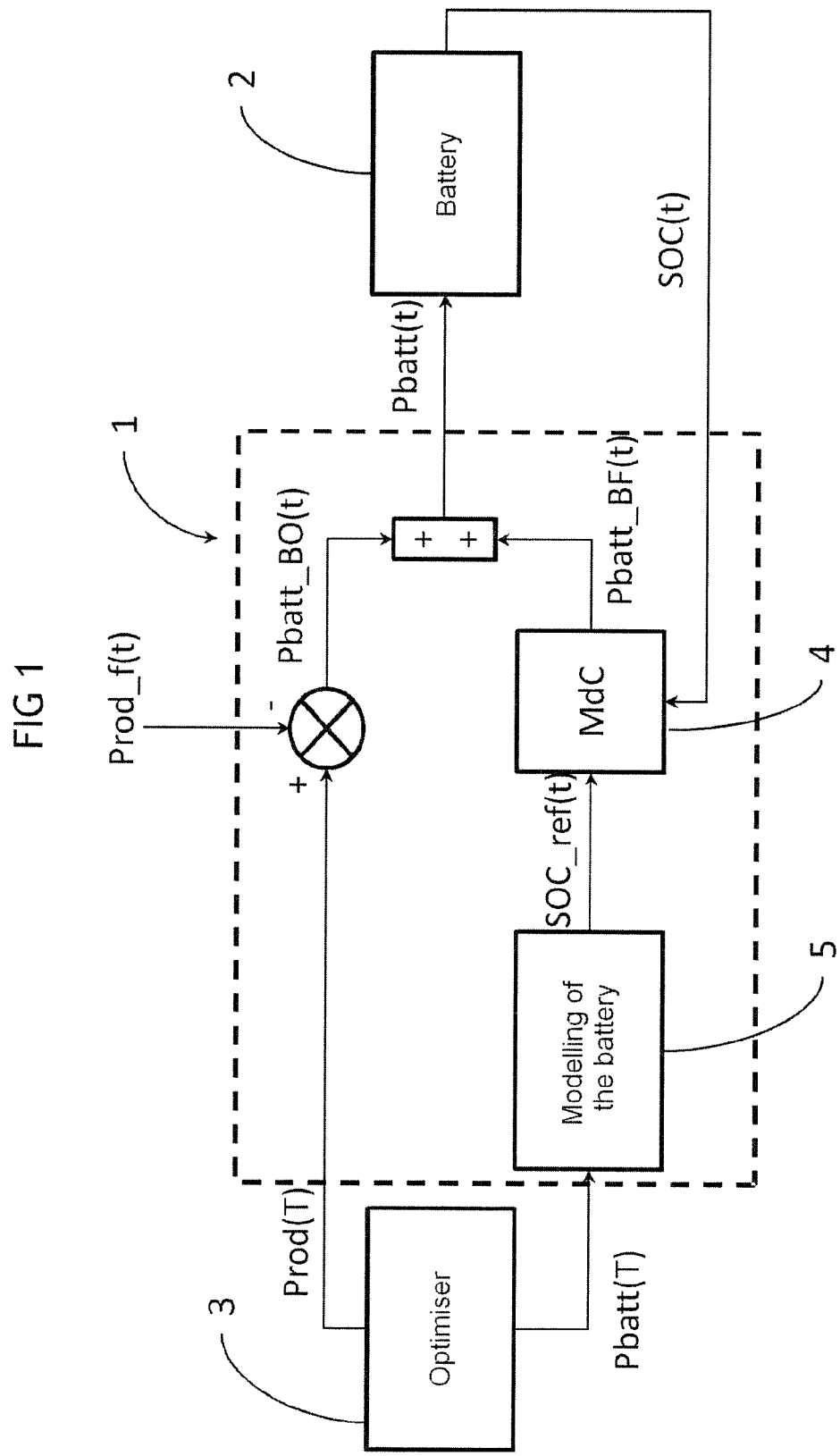

(51) Int. Cl.
*H02J 3/32* (2006.01)
*H02J 7/04* (2006.01)

(52) U.S. Cl.
CPC ................ *H02J 3/32* (2013.01); *H02J 7/008* (2013.01); *H02J 7/042* (2013.01)

(58) Field of Classification Search
USPC .......................................... 320/134; 702/63
See application file for complete search history.

(56) References Cited

U.S. PATENT DOCUMENTS

2012/0249078 A1   10/2012  Kim et al.
2014/0015469 A1*  1/2014  Beaston .................... H02J 3/32
                                                       320/101

* cited by examiner

FACILITY FOR CONTROLLING AN ENERGY STORAGE BATTERY

GENERAL TECHNICAL FIELD AND CONTEXT OF THE INVENTION

The present invention relates to the field of electrical production, more precisely to a control central and the associated method for controlling a power storage battery intended to be coupled to a source of intermittent electrical production to provide an electric power network with total smooth electric power approaching a total power setpoint according to a production plan announced in advance to the network manager.

For several years now, energy production by means of intermittent sources electrical production such as wind turbine, photovoltaic, solar, etc. has been undergoing an unprecedented surge. Such sources of intermittent electrical production are generally grouped in farms, for example in the case of a field of wind turbines or an array of photovoltaic panels, and connected to an electric power network to which they supply electricity. In this document, source of intermittent electrical production shall designate both an isolated source and a farm comprising a plurality of sources, with centralised connection and management of production, to the extent where the electric power network sees only one electrical production centre.

The inevitably random character of these energy sources imposes rules particular to their exploitation, especially smoothing and guarantee of their production according to a plan announced in advance to the manager of the electrical network to which they are connected, failing which and despite the economic profit they can generate, their large-scale integration would pose many problems.

In fact, production of sources of intermittent electrical production is often poorly foreseen and their variations can cause large differentials relative to the reference production plan announced to the network manager. When the cumulative power of these productions intermittent becomes significant, it can imperil the supply-demand balance of the electrical system and destabilise the network, making them unattractive for managers of this network.

In fact, the power generated by a source of intermittent electrical production, varying considerably from one day to another, can also undergo major fluctuations in the space of one hour or a few minutes, due to local meteorological variations. For example, variation in wind speed causes variation in electric power produced by a wind turbine. Similarly, sunshine directly influences the electrical production of a photovoltaic panel, and passing clouds perturbs the latter.

It is easily understood that if some variations can be anticipated, for example by means of weather forecasting, no model can provide in advance local variation such as passing clouds, a transitory and local phenomenon which does however have major repercussions on the electrical production of photovoltaic panels.

A potential solution to the problem of unpredictability of electrical production is brought by the use of power storage means coupled to the intermittent production source. These storage means contribute both to intelligent management of energy produced and to improvement in the quality of supply. In allowing power storage, they especially enable a range of applications such as smoothing of production, energy arbitrage, participation in system services, charge transfer, relief of constraints on the electric distribution network, etc.

Today, several types of energy storage exist: electrostatic (capacities), electromagnetic (superconductors), electrochemical (batteries and supercapacitors), gravity (hydraulic storage), inertial (flywheel) pneumatic or even thermal.

Of these different technologies, storage by battery currently has major advantages of response speed and handling, offering more flexibility and stability for controlling installation of production constituted by the source of intermittent electrical production and the storage battery it is linked to, as well as relatively high power and tong service life. Hereinbelow power storage battery will be one or more individual batteries connected together such that they are controlled jointly as constituting only one storage battery vis-a-vis their use.

The storage battery is used to store the energy produced by the source of intermittent electrical production, and return it to the network, as a function of need. Proper management of these charge and discharge phases of the battery absorbs the variations in electrical production. It also better adapts the power supplied to the network to the extent where electrical production of a source of intermittent electrical production is not easily adaptable. The use of a storage battery can contribute to improving the predictability of supply and stabilise the electrical production.

For power storage means such as a battery, the capacity for absorbing the production differentials depends greatly on its dimensioning and often needs large capacity. It is tempting to recommend the use of batteries having large power-storage capacities. The majority of control techniques put forward in the prior art supposes considerable storage capacities.

However, to the extent where the running cost of a battery is closely linked to its sizing, a rise in the required capacity of a battery can considerably increase the cost of the system, making it economically unviable.

Means of circumventing the problem of sizing is to better plan the trajectory of the state of charge of the battery as a function of uncertainties of projections. This can be done by means of stochastic optimisation algorithms.

These processes of the prior art are supposed to prevent battery exhaustion, that is, its complete discharge, and battery saturation, that is, exceeding of its storage capacity. These two situations transmit fluctuations in production of the installation directly to the electric power network to which the power is supplied, and, in the case of saturation, a non-storable power loss deteriorates the yield of the installation comprising the intermittent production source and the storage battery.

The drawback to these stochastic management processes is the sub-use of the storage capacity available. This is also the case of predictive control processes supposed to ensure compromise between regulation of the state of charge at a fixed setpoint and smoothing of production of the production installation.

Some other applications utilise power storage batteries which are not coupled to a power station of intermittent electrical production to supply an electric power network with total electric power according to a production plan, but are utilised by an electrical power consumer to optimise its electricity consumption supplied by the electrical network, especially as a function of parameters such as time variation of the price of electricity.

For example, documents US2012/074909 and US2012/249078 disclose such systems, in which the charging or discharging of a battery is controlled as a function of criteria such as the price of electricity or its ecological impact. It should be noted that the battery is charged and discharged at maximal constant power, in an authorised range aimed at maximising the life expectancy of the battery.

However, such systems cannot respond to the smoothing requisite of intermittent electrical production, or to the guarantee of the electric power delivered at the point of connection to the electrical network. They cannot therefore be employed satisfactorily in a power station of intermittent electrical production intended to supply an electrical network with total power according to a production plan announced to the manager of the network.

PRESENTATION OF THE INVENTION

The invention hereinbelow presents an alternative to these processes which are not entirely satisfactory, which is both simple to carry out, inexpensive and enables good regulation of the electrical production without needing large power storage capacities to allow a power station of intermittent power production to supply an electric power network with total smooth electric power approaching a setpoint according to a production plan announced in advance to the manager of the network.

The invention proposes a control central of a power storage battery intended to be coupled to a source of intermittent electrical production to supply an electric power network with total electric power approaching a total power setpoint according to a production plan announced in advance to the manager of the network. The control central is adapted to determine a reference trajectory of the state of charge of the battery from a model of the battery and an optimised battery power setpoint, said optimised battery power setpoint being determined from the total power setpoint, and to perform regulation via closed-loop feedback control of the state of charge of the battery to impose tracking by the state of charge of the reference trajectory of the state of charge of the battery.

Regulation via closed-loop feedback control of the state of charge of the battery, activated in case of major drift of the state of charge of the battery, adjusts the dynamic response of the production installation by anticipating saturation or exhaustion of the battery and maintains the smoothing of total production of the installation.

The invention is advantageously completed by the following different characteristics taken atone or according to their different possible combinations:
  the control central is adapted so that the total electric power supplied to the network best approaches the total power setpoint and avoids the drift of the state of charge of the battery;
  the control central is adapted so that regulation via closed-loop feedback control of the state of charge is carried out in case of drift of the state of charge of the battery relative to the reference trajectory of the state of charge;
  the control central is adapted so that the drift of the state of charge corresponds to exceeding a dead band defined around a reference trajectory of the state of charge of the battery;
  the control central comprises regulation limitation means via closed-loop feedback control of the state of charge to the only follow-up of the reference trajectory of the state of charge of the battery which move the state of charge away from the limits of the battery;
  regulation via closed-loop feedback control of the state of charge inputs the reference trajectory of the state of charge and the state of charge of the battery to provide at output a closed-loop battery power setpoint;
  said control central controls the battery by means of an instantaneous power command determined from:
    a closed-loop battery power setpoint at output of the regulation loop, and
    an open-loop battery power setpoint corresponding to the difference between the total production setpoint and the instantaneous production of the source of intermittent electrical production;
  the total power setpoint follows a trajectory, and the period of regulation via closed-loop feedback control of the state of charge is less by least a hundred times relative to the period of the trajectory followed by the total power setpoint.

The invention also relates to an electrical production installation comprising a power storage battery intended to be coupled to a source of intermittent electrical production to supply an electric power network with total electric power approaching a total power setpoint according to a production plan announced in advance to the manager of the network, said installation comprising a control central according to the invention. Preferably, the installation also comprises a source of intermittent electrical production.

The invention also relates to a control method of a power storage battery intended to be coupled to a source of intermittent electrical production to supply an electric power network with total electric power approaching a total power setpoint according to a production plan announced in advance to the manager of the network, in which a reference trajectory of the state of charge of the battery is determined from a model of the battery and an optimised battery power setpoint, said optimised battery power setpoint being determined from the total power setpoint, and a regulation via closed-loop feedback control of the state of charge is performed to impose tracking by the state of charge of the reference trajectory of the state of charge of the battery.

The method according to the invention is advantageously completed by the following various characteristics considered singly or according to their different possible combinations:
  regulation via closed-loop feedback control of the state of charge is performed in case of drift of the state of charge of the battery relative to a reference value of the state of charge;
  the drift of the state of charge corresponds to exceeding a dead band defined around a reference value of state of charge of the battery;
  regulation via closed-loop feedback control of the state of charge is limited to the only follow-up of the reference trajectory of the state of charge of the battery which move the state of charge away from the limits of the battery.

The invention also relates to a computer program product comprising program code instructions for execution of the steps of the method according to the invention, when said program is run on a computer. Preferably, this computer program product takes the form of a computer-readable medium storing said program code instructions.

PRESENTATION OF FIGURES

Figure 2:
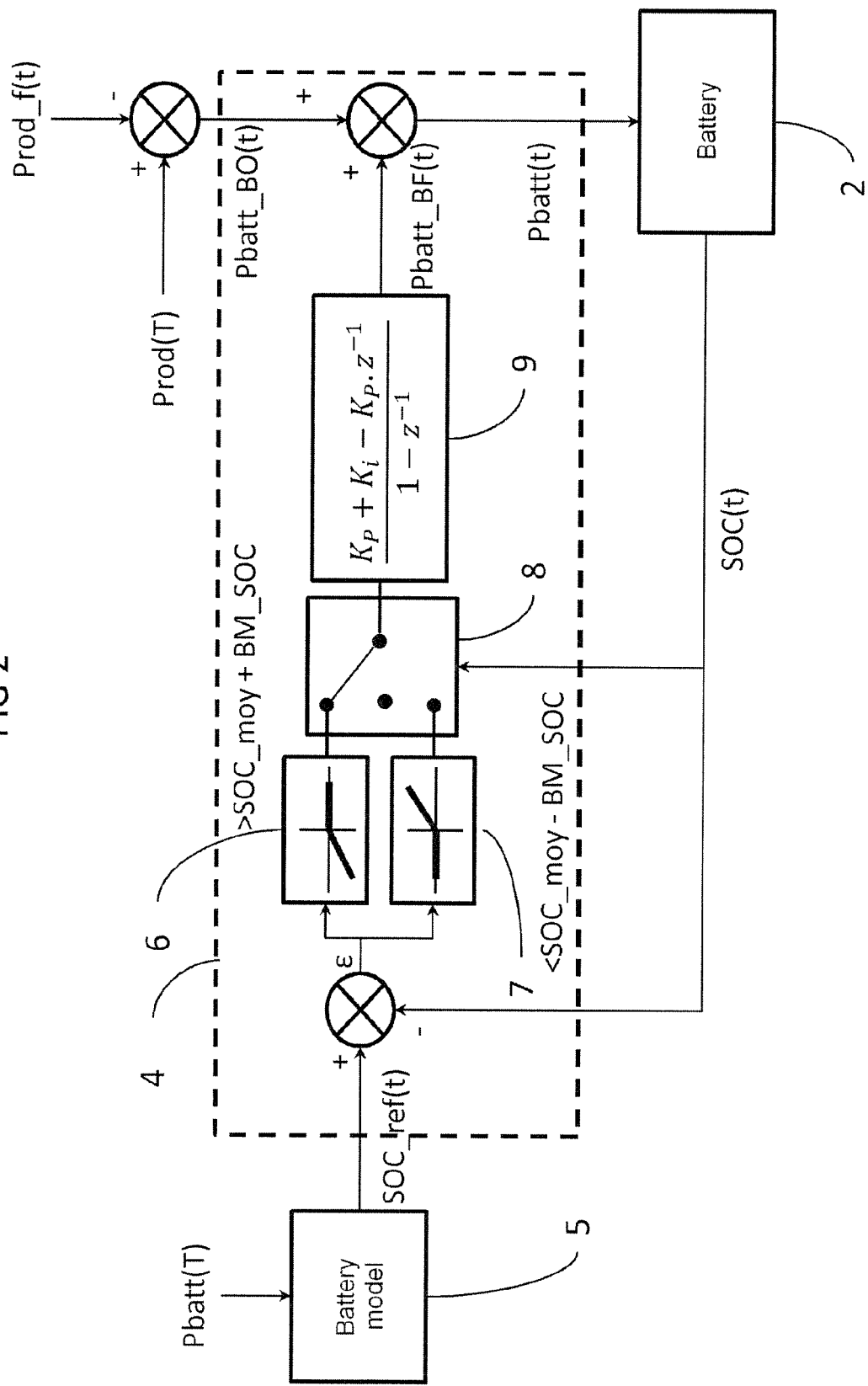

Other characteristics, aims and advantages of the invention will emerge from the following description which is purely illustrative and non-limiting and which must be considered with respect to the appended drawings, in which:
  FIG. 1 is a main diagram illustrating a control central associated with its battery according to a possible embodiment of the invention;

FIG. 2 is a main diagram illustrating the regulation closed-loop intervening in the system of FIG. 1.

DETAILED DESCRIPTION

In reference to FIG. 1, the electrical production installation comprises a control central 1 which controls the charge/discharge electric power of a storage battery 2 by means of an instantaneous power command Pbatt(t), variable over time. The storage battery 2 is coupled to a source of intermittent electrical production to supply an electric power network with total electric power approaching a total power setpoint Prod(T) according to a production plan announced in advance to the manager of the network.

The control central 1 receives from an optimiser 3 a total production plan constituted by a sequence of optimal setpoint of total production Prod(T), variable over time, with a so-called intraday period T of a typical duration of 30 minutes. This total production plan is set up by means of production projections, for example from meteorological data, and other factors such as the charge plan of the network manager, or the anticipation of power demand on the network. The total production plan corresponds to the total electrical production of the production installation composed of the electrical production of the intermittent source and the power delivered by the battery 2. An ideal installation should closely follow the total production plan.

The control central 1 receives an instantaneous measurement of the real production of the intermittent source Prod_f(t) and as a function of the latter adapts the power to supply or consume by the battery 2 to ensure tracking of the total production plan defined by the optimiser 3.

In fact, projection errors, unforeseen weather perturbations and natural fluctuations in production of the intermittent source result in a gap between the electrical instantaneous production Prod_f(t) of the intermittent source and the optimal setpoint of total power Prod(T) which must be supplied to the electrical network, which must be compensated by the battery 2, either by storage of the surplus power produced, or by restitution of power stored in the battery 2. So, the control central 1 calculates an open-loop battery power setpoint Pbatt_BO(t), variable over time, which serves to determine an instantaneous control of battery power Pbatt(t), variable over time, for controlling the battery 2.

The open-loop battery power setpoint Pbatt_BO(t) corresponding to the power control required of the battery 2 is therefore calculated open-loop at each instant t by Pbatt_BO(t)=Prod(T)−Prod_f(t).

However, the only open-loop control of the power of the battery can lead to exhaustion or the saturation of the battery in case of excessive and/or too long differential between the instantaneous electrical production Prod_f(t) of the intermittent source and the optimal setpoint of total production Prod(T).

To best make use of the battery, the optimiser 3 also determines an optimised battery power setpoint Pbatt(T), variable over time, which is supplied to the control central 1. The optimised battery power setpoint Pbatt(T) corresponds to a power storage plan which is determined by the optimiser 3 for control of the battery 2 to best respond to the total production plan, given the anticipated variations in production of the intermittent source, which the battery 2 must compensate.

For example, it can be provided that production of the intermittent source will be insufficient to ensure the electrical production required over a given period, the power storage plan can provide preventive storage of power prior to this given period to have, during said given period, sufficient power to enable tracking of the total production plan.

The role of the control central 1 is to ensure during each intraday period T tracking instantaneous of the optimal setpoint of total power Prod(T). In an ideal case, production supplied by the intermittent production source in real time is equal to its projection and tracking of the optimal setpoint of total power Prod(T) is ensured by simple application of the optimised battery power setpoint Pbatt(T), also calculated by the optimiser 3.

However, here too, errors in projection, unforeseen weather perturbations and natural fluctuations in production of the intermittent source can result in excessive gaps between the electrical production of the intermittent source and the production plan, resulting in exhaustion or saturation of the storage battery 2. In this case, because the battery 2 cannot absorb fluctuations in electrical production, these are transmitted to the network directly.

To avoid such situations, the control central 1 comprises a module for maintaining charge MdC 4 coupled to a model 5 of the battery, the two operating in real time at a fixed frequency and integrated into the classical optimisation chain of setpoints of the battery, i.e. the optimiser 3.

The main aim is to compensate errors in projections and fluctuations in production and monitor and control the state of charge of the battery 2 in order to best avoid exhaustion and saturation from leading to invalidity of the battery 2, that is, its non-availability due to a lack or saturation of stored power.

The control central 1 is adapted to determine a reference trajectory of the state of charge of the battery SOC_ref(t) from a model 5 of the battery and an optimised battery power setpoint Pbatt(T), said optimised battery power setpoint Pbatt(T) being determined from the total power setpoint Prod(T).

The model 5 of the battery translates the relation and the constraints between the power required of the battery 2 (when charging or discharging) and the charge the latter must have to respond. The model 5 of the battery inputs the optimised battery power setpoint Pbatt(T) and at output supplies a reference trajectory of the state of charge SOC_ref(t).

The reference trajectory of the state of charge SOC_ref(t) of the battery 2 is a temporal sequence of reference values of said state of charge SOC(t). This reference trajectory of the state of charge SOC_ref(t) represents the evolution of the battery charge which must be followed so that the battery 2 can respond to power requirements for tracking the optimised battery power setpoint Pbatt(T).

From the point of view of the state of charge of the battery 2, the open-loop battery power setpoint Pbatt_BO(t), different from the optimised battery power setpoint Pbatt(T), is seen as a disturbance which results in deviation from the state of charge SOC(t) relative to its reference trajectory of the state of charge SOC_ref(t). The latter is calculated by a simplified model of the battery as a function of the provided production Pbatt(T) for the intraday period T in progress:

$$SOC\_ref(t) = SOC\_ref(t-1) + Te(1/\eta_{dech} Pbatt^+(T) + \eta_{ch} \cdot Pbatt^-(T))$$

with $$Pbatt^+(T) = \begin{cases} Pbatt(T) & \text{if } Pbatt(T) > 0 \\ 0 & \text{if } Pbatt(T) \leq 0 \end{cases}$$

and

-continued $$Pbatt^-(T) = \begin{cases} Pbatt(T) & \text{if } Pbatt(T) < 0 \\ 0 & \text{if } Pbatt(T) \geq 0 \end{cases}$$

where $\eta_{ch}$ and $\eta_{dech}$ are respectively the charge and discharge yield of the battery 2 and Te is the sampling period of the model 5 of the battery. The model 5 of the battery is a simplified model given purely by way of illustration, of the most complex and reliable battery models which can be envisaged, in which the reference trajectory of the state of charge SOC_ref(t) at output is not expressed linearly as a function of the charge or discharge power.

However, compensation of production differentials of the source of production relative to its projection can engender deviations from the state of charge SOC(t) relative to its optimised trajectory SOC_ref(t), which cumulatively can lead the state of charge SOC(t) to its limits of exhaustion or saturation of the battery 2. In such cases, since the battery 2 can no longer charge or discharge, fluctuations in production of the intermittent source will be directly transmitted to the electricity network.

To avoid these situations, the control central 1 is adapted to carry out regulation via closed-loop feedback control of the state of charge SOC(t) to impose tracking of the reference trajectory of the state of charge of the battery SOC_ref (t). This regulation via closed-loop feedback control of the state of charge SOC(t) is employed in case of drift of the state of charge of the battery relative to the reference trajectory of the state of charge of the battery SOC_ref(t), the drift of the state of charge corresponding to exceeding a dead band defined around a reference value of state of charge SOC(t) of the battery 2.

The control central is adapted so that the total electric power supplied to the network best approaches the total power setpoint Prod(T) and avoids the drift of the state of charge SOC(t) of the battery.

Indeed, deviation from the state of charge SOC(t) of the battery 2 relative to its reference, tolerated for average levels of charge, becomes problematic for levels near the storage limits of the battery 2, and can result in exhaustion or saturation of the battery 2. In fact, such a situation causes transmission of fluctuations of the intermittent production source to the electrical network, the battery 2 being incapable of compensating the latter.

This is why regulation via closed-loop feedback control of the state of charge SOC(t) is activated in case of exceeding by the state of charge SOC(t) a dead band defined around a reference value of state of charge SOC(t) of the battery 2. This reference value is preferably its average value, and the dead band is defined with hysteresis about this average value defined by:

$$SOC\_moy = \frac{SOC\_sup + SOC\_inf}{2}$$

where SOC_sup and SOC_inf are respectively the upper and lower limits of the state of charge SOC(t).

Preferably, the upper and lower limits of the state of charge are updated as a function of history of the state of charge SOC(t) to consider the variations of the physical storage limits of the battery 2.

This regulation via closed-loop feedback control is responsible for regulating the state of charge SOC(t) to follow the reference trajectory SOC_ref(T) by dynamically correcting the instantaneous power control Pbatt(t) for charging or discharging by the battery 2. For a low state of charge (respectively high), the positive (respectively negative) differentials between the measured state of charge SOC(t) and its reference trajectory SOC_ref(T) are tolerated, and only the negative (respectively positive) differentials are compensated. Exhaustion and saturation are avoided by forcing tracking of the reference trajectory of the state of charge SOC_ref(t) determined by means of model 5 of the battery and the setpoints sent by the optimisers.

This is done by means of a transitory response of the battery 2 the dynamic performance of which (response time, exceeding, steady-state differential, etc.) is controlled by the adjustable configuration parameters. This real-time regulation functions at a sampling period of the order of a second (between 1 and 10 seconds), fixed as a function of the frequency of acquisition and treatment of measurements.

In contrast, the total power setpoint Prod(T) and the optimised battery power setpoint Pbatt(T) have a much longer sampling period, at least by a factor of ten or hundred. Typically, this sampling period is at least 30 minutes. In fact, these setpoints result from daily and intraday optimisation mechanisms, but are not instantaneous. T designates the instants corresponding to at least intraday sampling levels, and t the instants corresponding to instantaneous sampling levels, of the order of 1 to 10 seconds.

Therefore, the total power setpoint Prod(T) follows a trajectory, and the period of regulation via closed-loop feedback control of the state of charge is less by at least a hundred times relative to the period of trajectory followed by the total power setpoint Prod (T).

FIG. 2 illustrates a possible embodiment of the regulation performed in the charge maintenance module 4. Instantaneous measuring of the state of charge SOC(t) of the battery 2 is acquired or supplied to the charge maintenance module 4. The state of charge SOC(t) is compared to the reference trajectory of state of charge SOC_ref(t) according to:

$$\epsilon = SOC\_ref(t) - SOC(t)$$

The resulting differential $\epsilon$ is taken into consideration only as a function of the level of the state of charge SOC(t) relative to an average level enclosed by a dead band.

The control central 1 carries out different treatment for tracking reference trajectory of the state of charge of the battery SOC_ref(t) which moves the state of charge SOC(t) away from the limits of the battery 2, and for tracking reference trajectory of the state of charge of the battery SOC_ref(t) which approaches the state of charge SOC(t) of the limits of the battery 2. In the first case, regulation via closed-loop feedback control of the state of charge SOC(t) is used, while in the second case regulation via closed-loop feedback control of the state of charge is not used.

In the embodiment illustrated, the differential $\epsilon$ between the reference trajectory of state of charge SOC_ref(t) and the state of charge SOC(t) is supplied to two threshold devices 6, 7, which transmit only the negative or positive differentials $\epsilon$ respectively. These two threshold devices 6, 7 constitute limitation means of regulation via closed-loop feedback control of the state of charge SOC(t) to the only follow-up of the reference trajectory of the state of charge of the battery SOC_ref(t) which move the state of charge SOC(t) away from the limits of the battery.

A switch 8 completes switching between the threshold devices 6, 7 and a disconnected state, as a function of the state of charge SOC(t), to send either the positive differentials in case of connection with the threshold device 6, or the negative differentials in case of connection with the threshold device 7, or nothing, to the Proportional-Integral corrector 9.

In the event where the state of charge of the battery SOC(t) is within a dead band centred on an average value of the state of charge SOC_moy, the switch 8 sends no differential (central position in FIG. 2).

In the event where the state of charge SOC(t) of the battery is greater than a high limit corresponding to exceeding by the upper limit of the dead band centred on the average value of the state of charge SOC_moy, the switch 8 sets up a connection between the threshold device 6 and the corrector 9. This is the configuration illustrated by FIG. 2. The battery 2 is close to saturation, and threatens to no longer being capable of ensuring its compensation rote, due to the impossibility of absorbing extra power.

The threshold device 6 lets through only the negative differentials $\epsilon$, the others being reset to zero, the corrector 9 has non-zero entries only when the state of charge of the battery SOC(t) is greater than the reference trajectory SOC_ref(t). In this case, regulation performed by the corrector 9 aims at steering the state of charge SOC(t) towards the charge trajectory SOC_ref(t), which is less, which corresponds to a drop in power stored in the battery 2.

Inversely, if the state of charge of the battery SOC(t) is less than the reference trajectory SOC_ref(t), the differential $\epsilon$ is positive, and due to the threshold device 6 the corrector receives a zero entry such that no correction is made.

In this way, for an excessively high state of charge of the battery, the positive differentials $\epsilon$ between the charge trajectory SOC_ref(t) and the state of charge SOC(t) are tolerated, while the negative differentials $\epsilon$ are compensated.

When tracking of the reference trajectory SOC_ref(t) causes a power storage demand on the battery 2, that is, when the differential $\epsilon$ is positive, this follow-up is not ensured. But when tracking of the reference trajectory SOC_ref(t) causes a drop in power stored in the battery 2, that is, when the differential is negative, tracking of the reference trajectory SOC_ref(t) moves the state of charge away from the physical storage limits, and therefore conserves the capacity of the battery 2 to absorb fluctuations.

In the same way, in the event where the state of charge SOC(t) of the battery is less than a low limit corresponding to exceeding by the lower limit of a dead band centred on an average value of the state of charge SOC_moy, the switch 8 sets a connection between the threshold device 7 and the corrector 9. The battery 2 is deeply discharged, and threatens to be no longer capable of ensuring its role of compensation, by tack of stored power.

The threshold device 7 lets through only positive differentials $\epsilon$, the others being reset to zero, the corrector 9 has non-zero entries only when the state of charge of the battery SOC(t) is less than the reference trajectory SOC_ref(t). In this case, regulation performed by the corrector 9 aims at steering the state of charge SOC(t) towards the charge trajectory SOC_ref(t), which is greater, which corresponds to a rise in power stored in the battery 2.

Inversely, if the state of charge of the battery SOC(t) is greater than the reference trajectory SOC_ref(t), the differential $\epsilon$ is negative, and due to the threshold device 7 the corrector receives a zero entry such that no correction is made. So, for an excessively low state of charge of the battery, the negative differentials $\epsilon$ between the charge trajectory SOC_ref(t) and the state of charge SOC(t) are tolerated, while the positive differentials $\epsilon$ are compensated.

In this way, when tracking of the reference trajectory SOC_ref(t) causes a demand in power on the battery 2, that is, when the differential is negative, this tracking is no longer ensured. But, when tracking of the reference trajectory SOC_ref(t) causes a rise in the power stored in the battery 2, that is, when the differential is positive, tracking of the reference trajectory SOC_ref(t) moves the state of charge away from the physical storage limits, and therefore conserves the capacity of the battery 2 to absorb fluctuations.

Such an approach prevents drift of the state of charge SOC(t) to the physical storage limits (low and high).

The corrector 9 calculates a closed-loop battery power setpoint (Pbatt_BF(t)), which is added to the open-loop battery power setpoint (Pbatt_BO(t)) to give the instantaneous battery control Pbatt(t), which is applied to the battery 2 to control it. So, the control central controls the battery 2 by means of an instantaneous power command Pbatt(t) determined from:
- a closed-loop battery power setpoint Pbatt_BF(t) at output of the regulation loop, and
- an open-loop battery power setpoint Pbatt_BO(t) corresponding to the difference between the total production setpoint Prod(T) and the instantaneous production Prod_f(t) of the source of intermittent electrical production.

The corrector 9 used for regulation of the state of charge SOC(t) is a Proportional-Integral filter (PI) which adjusts the transitory performance of the "anticipative" reaction.

The two parameters $K_p$ (proportional gain) and $K_i$ (integral gain) of the corrector 9 determine the response time and the passband of the loop system as well as amplitude of the closed-loop battery power setpoint (Pbatt_BF(t)). The higher $K_p$ and $K_i$ are, the faster the reaction despite a high-amplitude control. The effect of variations of the open-loop battery power setpoint Pbatt_BO(t) on the closed-loop battery power setpoint Pbatt_BF(t), by suite on the total power supplied to the network, is less filtered.

However and for low values of $K_p$ and $K_i$, the effect of variations of the open-loop battery power setpoint Pbatt_BO(t) on the closed-loop battery power setpoint Pbatt_BF(t) is negligible but the response time of the reaction is longer. These parameters are regulated as a function of the preferred response, the frequency of variations of Pbatt_BO(t) which are directly linked to fluctuations in production of the source of intermittent electrical production and the demands of the user of the battery 2 in terms of stresses of the battery 2 and service life.

The invention also relates to an electrical production installation comprising a power storage battery 2 intended to be coupled to a source of intermittent electrical production to follow a total power setpoint, said installation comprising a control central 1 according to the invention. Preferably, the installation also comprises a source of intermittent electrical production.

The invention also relates to a method for controlling the storage battery as per the implementation of the control central according to the invention.

The invention claimed is:

1. A control central of a power storage battery intended to be coupled to a source of intermittent electrical production for supplying an electric power network with total electric power approaching a total power setpoint according to a production plan announced in advance to the manager of the network, said power storage battery having a state of charge,
wherein the control central is adapted to determine a reference trajectory of the state of charge of the power storage battery from a model of the power storage battery and an optimised setpoint of battery power, said optimised battery power setpoint being determined from the total power setpoint, and wherein the control central is adapted to perform regulation via closed-loop feedback control of the state of charge of the power storage battery to impose tracking, by the state of charge of the power storage battery, of the reference trajectory of the state of charge of the power storage battery.

2. The control central according to the claim 1, said central being adapted so that the total electric power supplied to the network best approaches the total power setpoint and avoids drift of the state of charge of the power storage battery.

3. The control central according to claim 1, said central being adapted so that regulation via closed-loop feedback control of the state of charge of the power storage battery is performed in case of drift of the state of charge of power storage the battery relative to the reference trajectory of the state of charge of the power storage battery.

4. The control central according to the claim 3, said central being adapted so that the drift of the state of charge of the power storage battery corresponds to exceeding a dead band defined around a reference trajectory of the state of charge of the power storage battery.

5. The control central according to claim 1, comprising regulation limitation means via closed-loop feedback control of the state of charge of the power storage battery to the only follow-up of the reference trajectory of the state of charge of the power storage battery which move the state of charge charge of the power storage battery away from the limits of the power storage battery.

6. The control central according to claim 1, wherein regulation via closed-loop feedback control of the state of charge of the power storage battery inputs the reference trajectory of the state of charge of the power storage battery and the state of charge of the power storage battery to supply at output a closed-loop battery power setpoint.

7. The control central according to claim 1, said control central controlling the power storage battery by means of an instantaneous power command determined from:
- a closed-loop battery power setpoint at output of the regulation loop, and
- an open-loop battery power setpoint corresponding to the difference between the total production setpoint and the instantaneous production of the source of intermittent electrical production.

8. The control central according to claim 1, wherein the total power setpoint follows a trajectory, and the period of the regulation closed-loop of the state of charge of the power storage battery is less by at least a hundred times relative to the period of the trajectory followed by the total power setpoint.

9. An electrical production installation comprising a power storage battery intended to be coupled to a source of intermittent electrical production to supply an electric power network with total electric power approaching a total power setpoint according to a production plan announced in advance to the manager of the network, said power storage battery having a state of charge, wherein said installation comprises a control central, wherein the control central is adapted to determine a reference trajectory of the state of charge of the power storage battery from a model of the power storage battery and an optimised setpoint of battery power, said optimised battery power setpoint being determined from the total power setpoint, and wherein the control central is adapted to perform regulation via closed-loop feedback control of the state of charge of the power storage battery to impose tracking, by the state of charge of the power storage battery, of the reference trajectory of the state of charge of the power storage battery.

10. The electrical production installation according to the claim 9, further comprising a source of intermittent electrical production coupled to the power storage battery.

11. A method for controlling a power storage battery intended to be coupled to a source of intermittent electrical production to supply an electric power network with total electric power approaching a total power setpoint according to a production plan announced in advance to the manager of the network, said power storage battery having a state of charge, wherein a reference trajectory of the state of charge of the power storage battery is determined from a model of the power storage battery and an optimised battery power setpoint, said optimised battery power setpoint being determined from the total power setpoint, and regulation via closed-loop feedback control of the state of charge of the power storage battery is performed to impose tracking by the state of charge of the power storage battery, of the reference trajectory of the state of charge of the power storage battery.

12. A non-volatile computer readable medium comprising a memory storing program code instructions for execution of the steps of the method for controlling a power storage battery according to claim 11, when said program is run on a computer of a control central controlling a power storage battery and reading the memory of said non-volatile computer readable medium.

* * * * *